US012125701B2

(12) United States Patent
Khlebnikov et al.

(10) Patent No.: US 12,125,701 B2
(45) Date of Patent: Oct. 22, 2024

(54) LARGE DIMENSION SILICON CARBIDE SINGLE CRYSTALLINE MATERIALS WITH REDUCED CRYSTALLOGRAPHIC STRESS

(71) Applicant: Wolfspeed, Inc., Durham, NC (US)

(72) Inventors: Yuri Khlebnikov, Raleigh, NC (US); Varad R. Sakhalkar, Morrisville, NC (US); Caleb A. Kent, Durham, NC (US); Valeri F. Tsvetkov, Durham, NC (US); Michael J. Paisley, Raleigh, NC (US); Oleksandr Kramarenko, Durham, NC (US); Matthew David Conrad, Durham, NC (US); Eugene Deyneka, Raleigh, NC (US); Steven Griffiths, Morrisville, NC (US); Simon Bubel, Carrboro, NC (US); Adrian R. Powell, Cary, NC (US); Robert Tyler Leonard, Raleigh, NC (US); Elif Balkas, Cary, NC (US); Curt Progl, Raleigh, NC (US); Michael Fusco, Wake Forest, NC (US); Alexander Shveyd, Chapel Hill, NC (US); Kathy Doverspike, Cary, NC (US); Lukas Nattermann, Chapel Hill, NC (US)

(73) Assignee: Wolfspeed, Inc., Durham, NC (US)

( * ) Notice: Subject to any disclaimer, the term of this patent is extended or adjusted under 35 U.S.C. 154(b) by 830 days.

(21) Appl. No.: 17/121,863

(22) Filed: Dec. 15, 2020

(65) Prior Publication Data
US 2022/0189768 A1    Jun. 16, 2022

(51) Int. Cl.
*C30B 29/36* (2006.01)
*C30B 23/02* (2006.01)
(Continued)

(52) U.S. Cl.
CPC ........ *H01L 21/02378* (2013.01); *C30B 23/02* (2013.01); *C30B 29/36* (2013.01); *H01L 21/0242* (2013.01); *C30B 23/005* (2013.01)

(58) Field of Classification Search
CPC ........... H01L 21/02378; H01L 21/0242; C30B 23/02; C30B 29/36; C30B 23/005
See application file for complete search history.

(56) References Cited

U.S. PATENT DOCUMENTS 6,045,613 A    4/2000  Hunter
6,218,680 B1   4/2001  Carter, Jr. et al.
(Continued)

FOREIGN PATENT DOCUMENTS

CN    109321980 A    2/2019
CN    110541199 A    12/2019
(Continued)

OTHER PUBLICATIONS

Ailihumaer et al "relationship between basal plane dislocation distribution and local basal plane dending in PVT grown 4H-SiC crystals", Journal of Electronic Materials vol. 49, No. 6, Jan. 2020, pp. 3455-3464.*

(Continued)

*Primary Examiner* — Robert M Kunemund
(74) *Attorney, Agent, or Firm* — Sage Patent Group

(57) ABSTRACT

Silicon carbide (SiC) materials including SiC wafers and SiC boules and related methods are disclosed that provide large dimension SiC wafers with reduced crystallographic stress. Growth conditions for SiC materials include maintaining a generally convex growth surface of SiC crystals, adjusting differences in front-side to back-side thermal profiles of growing SiC crystals, supplying sufficient source flux to allow commercially viable growth rates for SiC crystals, and reducing the inclusion of contaminants or non-SiC (Continued)

particles in SiC source materials and corresponding SiC crystals. By forming larger dimension SiC crystals that exhibit lower crystallographic stress, overall dislocation densities that are associated with missing or additional planes of atoms may be reduced, thereby improving crystal quality and usable SiC crystal growth heights.

10 Claims, 7 Drawing Sheets

(51) Int. Cl.
    *H01L 21/02*     (2006.01)
    *C30B 23/00*     (2006.01)

(56) References Cited

U.S. PATENT DOCUMENTS

| | | |
|---|---|---|
| 6,396,080 B2 | 5/2002 | Carter, Jr. et al. |
| 6,403,982 B2 | 6/2002 | Carter, Jr. et al. |
| 6,639,247 B2 | 10/2003 | Carter, Jr. et al. |
| 6,749,685 B2 | 6/2004 | Coleman |
| 7,147,715 B2 | 12/2006 | Malta et al. |
| 7,192,482 B2 | 3/2007 | Mueller et al. |
| 7,276,117 B2 | 10/2007 | Basceri et al. |
| 7,294,324 B2 | 11/2007 | Powell et al. |
| 7,300,519 B2 | 11/2007 | Tsvetkov et al. |
| 7,314,521 B2 | 1/2008 | Powell et al. |
| 7,316,747 B2 | 1/2008 | Jenny et al. |
| 7,323,051 B2 | 1/2008 | Hobgood et al. |
| 7,323,052 B2 | 1/2008 | Tsvetkov et al. |
| 7,351,286 B2 | 4/2008 | Leonard et al. |
| 7,364,617 B2 | 4/2008 | Mueller et al. |
| 7,387,680 B2 | 6/2008 | Tsvetkov et al. |
| 7,422,634 B2 | 9/2008 | Powell et al. |
| 7,547,897 B2 | 6/2009 | Suvorov |
| 7,563,321 B2 | 7/2009 | Powell et al. |
| 7,601,441 B2 | 10/2009 | Jenny et al. |
| 8,147,991 B2 | 4/2012 | Jenny et al. |
| 8,384,090 B2 | 2/2013 | Powell et al. |
| 8,618,552 B2 | 12/2013 | Powell et al. |
| 8,785,946 B2 | 7/2014 | Powell et al. |
| 8,980,445 B2 | 3/2015 | Leonard et al. |
| 9,018,639 B2 | 4/2015 | Loboda et al. |
| 9,099,377 B2 | 8/2015 | Basceri et al. |
| 9,165,779 B2 | 10/2015 | Loboda et al. |
| 9,200,381 B2 | 12/2015 | Leonard et al. |
| 9,790,619 B2 | 10/2017 | Leonard et al. |
| 10,867,797 B2 | 12/2020 | Suvorov et al. |
| 2003/0233975 A1 | 12/2003 | Jenny et al. |
| 2004/0144301 A1* | 7/2004 | Neudeck .............. C30B 25/18 117/86 |
| 2006/0075958 A1* | 4/2006 | Powell .................. C30B 29/36 117/89 |
| 2013/0153928 A1 | 6/2013 | Leonard et al. |
| 2014/0291698 A1 | 10/2014 | Powell et al. |
| 2015/0068457 A1* | 3/2015 | Drachev ............. C30B 29/36 118/726 |
| 2017/0321345 A1 | 11/2017 | Xu et al. |
| 2018/0187332 A1 | 7/2018 | Powell et al. |
| 2019/0245044 A1 | 8/2019 | Hori |
| 2019/0345635 A1* | 11/2019 | Vogel ............... H01L 21/02021 |
| 2020/0071847 A1 | 3/2020 | Vogel et al. |
| 2020/0152528 A1 | 5/2020 | Nishihara |

FOREIGN PATENT DOCUMENTS

| | | |
|---|---|---|
| EP | 2192211 A1 | 6/2010 |
| EP | 3382067 A1 | 10/2018 |
| WO | 2017053883 A1 | 3/2017 |

OTHER PUBLICATIONS

Author Unknown, "Guide for Metrology for Measuring Thickness, Total Thickness Variation, Bow, Warp/Sori, and Flatness of Bonded Wafer Stacks," SEMI 3D4-0915, Sep. 2015, SEMI, Milpitas, California, 41 pages.
Author Unkown, "Test Method for Measuring Bow and Warp on Silicon Wafers by Automated Noncontact Scanning," SEMI MF1390-0218, Feb. 2018, SEMI, Milpitas, California, 12 pages.
Author Unkown, "Test Method for Measuring Flatness, Thickness, and Total Thickness Variation on Silicon Wafers by Automated Noncontact Scanning," SEMI MF1530-0707, Oct. 2018, SEMI, Milpitas, California, 12 pages.
Author Unkown, "Test Method for Measuring Sori on Silicon Wafers by Automated Noncontact Scanning," SEMI MF 1451-0707, Mar. 2019, SEMI, Milpitas, California, 11 pages.
Author Unknown, "Test Method for Measurement of Thickness and Shape of Crystalline Sapphire Wafers by Using Optical Probes," SEMI HB6-0316, Mar. 2016, SEMI, Milpitas, California, 20 pages.
Author Unknown, "Wafer Flatness," Specifications, wafertech.co.uk, accessed as early as Jul. 22, 2019, Wafer Technology Ltd, 1 page.
Cree, Inc., "Cree Silicon Carbide Substrates and Epitaxy," MAT-CATALOG.00Q, 2013, 17 pages.
Goldstein, M., et al., "450 mm silicon wafer challenges—wafer thickness scaling," ECS Transactions, vol. 16, Issue 6, Oct. 2008, The Electrochemical Society, pp. 3-13.
Stockmeier, M., et al., "On the lattice parameters of silicon carbide," Journal of Applied Physics, vol. 105, 2009, 4 pages.
Office Action for Taiwanese Patent Application No. 109146203, mailed Jul. 8, 2022, 3 pages.
International Search Report and Written Opinion for International Patent Application No. PCT/US2021/063238, mailed Jun. 7, 2022, 22 pages.
Chen, Xiufang, et al., "Relaxation of residual stresses in SiC wafers by annealing," Rare Metals, vol. 25, Issue 6, Dec. 2006, 5 pages.
Ma, R.-H., et al., "Thermal system design and dislocation reduction for growth of wide band gap crystals: application to SiC growth," Journal of Crystal Growth, vol. 258, Nov. 2003, Elsevier B.V., pp. 318-330.
International Search Report and Written Opinion for International Patent Application No. PCT/US2020/065520, mailed Apr. 9, 2021, 19 pages.
Nakamura, et al., "Ultrahigh-quality silicon carbide single crystals," Nature, vol. 430, Issue 7003, Aug. 2004, Nature Publishing Group, pp. 1009-1012.
Invitation to Pay Additional Fees and Partial Search for International Patent Application No. PCT/US2021/063238, mailed Apr. 14, 2022, 18 pages.
Office Action for Taiwanese Patent Application No. 109146203, mailed Aug. 13, 2021, 13 pages.
Office Action dated Aug. 20, 2024, for Japanese Application No. 2023-536004, 3 pages.

* cited by examiner

LARGE DIMENSION SILICON CARBIDE SINGLE CRYSTALLINE MATERIALS WITH REDUCED CRYSTALLOGRAPHIC STRESS

FIELD OF THE DISCLOSURE

The present disclosure relates to crystalline materials, and more specifically to large dimension silicon carbide single crystalline materials with reduced crystallographic stress.

BACKGROUND

Silicon carbide (SiC) exhibits many attractive electrical and thermophysical properties. SiC is especially useful due to its physical strength and high resistance to chemical attack as well as various electronic properties, including radiation hardness, high breakdown field, a relatively wide band gap, high saturated electron drift velocity, high temperature operation, and absorption and emission of high energy photons in the blue, violet, and ultraviolet regions of the spectrum. Compared with conventional wafer or substrate materials, including silicon and sapphire, such properties of SiC make it more suitable for the fabrication of wafers or substrates for high power density solid state devices, such as power electronic, radio frequency, and optoelectronic devices. SiC occurs in many different crystal structures called polytypes, with certain common polytypes (e.g., 4H—SiC and 6H—SiC) having a hexagonal crystal structure.

While SiC exhibits superior materials properties, crystal growth techniques required to grow SiC are very different and significantly more challenging than conventional growth processes for other crystalline materials. Conventional crystalline materials utilized in semiconductor manufacturing, such as silicon and sapphire, have significantly lower melting points, allowing for direct crystal growth techniques from melted source materials that enable fabrication of large diameter crystalline materials. In contrast, bulk crystalline SiC is often produced by a seeded sublimation growth process at high temperatures where various challenges include impurity incorporation, structural defects associated with thermal and crystallographic stress, and formation of unintended polytypes, among others. In a typical SiC growth technique, a substrate and a source material are both placed inside of a reaction crucible. A thermal gradient created when the crucible is heated encourages vapor phase movement of the materials from the source material to the substrate followed by condensation upon the substrate and resulting bulk crystal growth. It is known that impurities can be introduced as dopants into SiC and that these dopants can regulate certain properties. For sublimation growth of SiC, a dopant can be introduced into the chamber in a variety of manners so that the dopant will be present in the SiC crystal produced from that process. The process is controlled to provide an appropriate concentration of the dopant for a particular application. Following bulk crystal growth, individual wafers of SiC may be obtained by slicing a bulk crystal ingot or boule of SiC, and the individual wafers may subsequently be subjected to additional processes, such as lapping or polishing.

The unique properties of SiC wafers enable the design and fabrication of an array of high power and/or high frequency semiconductor devices. Continuous development has led to a level of maturity in the fabrication of SiC wafers that allows such semiconductor devices to be manufactured for increasingly widespread commercial applications. As the semiconductor device industry continues to mature, SiC wafers having larger usable diameters are desired. Usable diameters of SiC wafers can be limited by certain structural defects in the material composition of SiC as well as certain wafer shape characteristics. Structural defects in the material composition may include dislocations (e.g., micropipes, threading edge, threading screw and/or basal plane dislocations), hexagonal voids, and stacking faults, among others. Wafer shape characteristics associated with SiC may include warp, bow, and thickness variation that can relate to wafer flatness. These various structural defects and wafer shape characteristics can contribute to crystallographic stresses that can be detrimental to fabrication and proper operation of semiconductor devices subsequently formed on conventional SiC wafers. Such crystallographic stresses are generally proportional to the radius of the wafer squared and as a result, it is difficult to economically fabricate larger diameter SiC semiconductor wafers of high quality.

The art continues to seek improved SiC wafers with larger dimensions and related solid-state devices while overcoming challenges associated with conventional SiC wafers.

SUMMARY

Silicon carbide (SiC) materials including SiC wafers and SiC boules and related methods are disclosed that provide large dimension SiC wafers with reduced crystallographic stress. Growth conditions for SiC materials include maintaining a generally convex growth surface of SiC crystals, adjusting differences in front-side to back-side thermal profiles of growing SiC crystals, supplying sufficient source flux to allow commercially viable growth rates for SiC crystals, and reducing the inclusion of contaminants or non-SiC particles in SiC source materials and corresponding SiC crystals. By forming larger dimension SiC crystals that exhibit lower crystallographic stress, overall dislocation densities that are associated with missing or additional planes of atoms may be reduced, thereby improving crystal quality and usable SiC crystal growth heights.

In one aspect, A SiC wafer comprises a dimension of at least 195 millimeters (mm) and a total line density of basal plane dislocations that are aligned within 5 degrees of a $\{1\bar{1}00\}$ family of crystal planes of less than 1000 centimeters per centimeter cubed ($cm/cm^3$) for a first area bounded by a radius from a center of the SiC wafer, the radius comprising at least 50% of a wafer radius of the SiC wafer. In certain embodiments, the dimension is in a range from 195 mm to 205 mm, or in a range from 195 mm to 455 mm, or in a range from 195 mm to 305 mm. In certain embodiments, the total line density of basal plane dislocations that are aligned within 5 degrees of the $\{1\bar{1}00\}$ family of crystal planes is in a range from 0 $cm/cm^3$ to less than 1000 $cm/cm^3$, or in a range from 20 $cm/cm^3$ to less than 1000 $cm/cm^3$. In certain embodiments, the total line density of basal plane dislocations that are aligned within 5 degrees of the $\{1\bar{1}00\}$ family of crystal planes in the first area is less than 200 $cm/cm^3$, or less than 100 $cm/cm^3$. In certain embodiments, the radius that bounds the first area comprises at least 90% of the wafer radius of the SiC wafer, or at least 95% of the wafer radius of the SiC wafer. In certain embodiments, the SiC wafer further comprises a second area that is defined between the first area and a perimeter edge of the SiC wafer, wherein the second area comprises a total line density of basal plane dislocations that are aligned within 5 degrees of the $\{1\bar{1}00\}$ family of crystal planes that is higher than the first area. In certain embodiments, the total line density of basal plane dislocations that are aligned within 5 degrees of the $\{1\bar{1}00\}$ family of crystal planes in the second area is less than 1000 cm/cm³. In certain embodiments, the SiC wafer comprises a 4H—SiC wafer, or semi-insulating SiC, or n-type SiC.

In another aspect, a SiC boule comprises a width in a range from 195 mm to 305 mm and a boule height in a range from 50 mm to 300 mm. In certain embodiments, the width is in a range from 195 mm to 205 mm, or in a range from 100 mm to 300 mm. In certain embodiments, at least 50% of the boule height is configured to provide a plurality of SiC wafers and each SiC wafer of the plurality of SiC wafers comprises a total line density of basal plane dislocations that are aligned within 5 degrees of a $\{1\bar{1}00\}$ family of crystal planes of less than 1000 cm/cm³ for a first area bounded by a radius from a center of the SiC wafer, the radius comprising at least 50% of a wafer radius of the SiC wafer. In certain embodiments, the radius is at least 90% of the wafer radius. In certain embodiments, the total line density of basal plane dislocations that are aligned within 5 degrees of the $\{1\bar{1}00\}$ family of crystal planes in the first area is less than 200 cm/cm³, or less than 100 cm/cm³. In certain embodiments, at least 75% of the boule height is configured to provide a plurality of SiC wafers and each SiC wafer of the plurality of SiC wafers comprises a total line density of basal plane dislocations that are aligned within 5 degrees of a $\{1\bar{1}00\}$ family of crystal planes of less than 1000 cm/cm³ for a first area bounded by a radius from a center of the SiC wafer, the radius comprising at least 50% of a wafer radius of the SiC wafer. In certain embodiments, the radius is at least 90% of the wafer radius. In certain embodiments, the total line density of basal plane dislocations that are aligned within 5 degrees of the $\{1\bar{1}00\}$ family of crystal planes in the first area is less than 200 cm/cm³, or less than 100 cm/cm³. In certain embodiments, the SiC boule is an A-face SiC boule, or an M-face SiC boule, or a $\{03\bar{3}8\}$-face SiC boule.

In another aspect, a method for providing SiC source material for crystal growth comprises: forming a plurality of milling media from a SiC crystalline material; and increasing a density of a SiC source powder by milling the SiC source powder with the plurality of milling media. In certain embodiments, the method further comprises removing surface contamination from the plurality of milling media before reducing a particle size of the SiC source powder. In certain embodiments, removing the surface contamination comprises using a milling process before reducing the particle size of the SiC source powder. In certain embodiments, removing the surface contamination further comprises applying a chemical etch to the plurality of milling media. In certain embodiments, the SiC crystalline material comprises a SiC crystal boule. In certain embodiments, forming the plurality of milling media comprises wire sawing the SiC crystal boule. In certain embodiments, the density of the SiC source powder is in a range from 1.5 grams per cubic centimeter (g/cm³) to 3.2 g/cm³, or in a range from 1.5 g/cm³ to 2.5 g/cm³ after milling with the plurality of milling media.

In another aspect, a method for forming a SiC single crystalline material comprises: growing a SiC boule with a width in a range from 195 mm to 305 mm and a boule height in a range from 50 mm to 300 mm. In certain embodiments, the method further comprising separating a plurality of SiC wafers from the SiC boule, wherein each of the plurality of SiC wafers has a width in a range from 195 mm to 305 mm. In certain embodiments, the SiC boule is grown along a (0001) crystal plane. In certain embodiments, the SiC boule is grown along an M-plane of the SiC boule. In certain embodiments, the method further comprises separating a plurality of SiC wafers from the SiC boule along a (0001) crystal plane of the SiC boule or within 4 degrees of the (0001) crystal plane of the SiC boule. In certain embodiments, the method further comprises separating a plurality of SiC wafers from the SiC boule along one of a $\{1\bar{1}00\}$ family of crystal planes of the SiC boule. In certain embodiments, the SiC boule is grown along an A-plane of SiC boule. In certain embodiments, the method further comprises separating a plurality of SiC wafers from the SiC boule along a (0001) crystal plane of the SiC boule. In certain embodiments, the method further comprises separating a plurality of SiC wafers from the SiC boule along one of a $\{11\bar{2}0\}$ family of crystal planes of the SiC boule. In certain embodiments, the SiC boule is grown along one of a $\{03\bar{3}8\}$ family of crystal planes of the SiC boule. In certain embodiments, the method further comprises separating a plurality of SiC wafers from the SiC boule along a (0001) crystal plane of the SiC boule. In certain embodiments, the method further comprises separating a plurality of SiC wafers from the SiC boule along one of a $\{03\bar{3}8\}$ family of crystal planes of the SiC boule. In certain embodiments, growing the SiC boule comprises providing a SiC source material with a source density in a range from 0.9 g/cm³ to 3.2 g/cm³, or in a range from 0.9 g/cm³ to 2.5 g/cm³, or in a range from 1.5 g/cm³ to 3.2 g/cm³, or in a range from 1.5 g/cm³ to 2.5 g/cm³. In certain embodiments, growing the SiC boule comprises providing a SiC source powder with a tap density in a range from 0.9 g/cm³ to 3.2 g/cm³, or in a range from 1.5 g/cm³ to 2.5 g/cm³.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
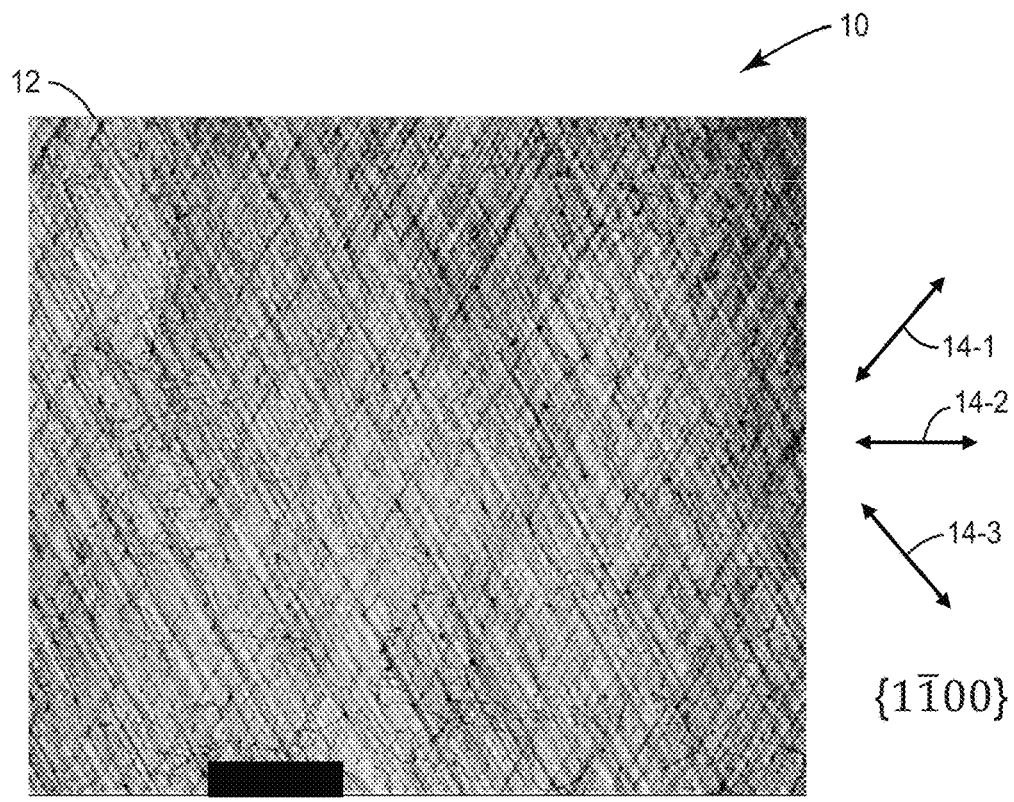
FIG. 1A is an x-ray topography image of a 1 cm by 1 cm portion of a 4H silicon carbide (SiC) wafer where basal plane dislocations are visible that are closely aligned with the $\{1\bar{1}00\}$ family of crystallographic planes.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Common elements between figures may be shown herein with common element numbers and may not be subsequently re-described.

Silicon carbide (SiC) materials including SiC wafers and SiC boules and related methods are disclosed that provide large dimension SiC wafers with reduced crystallographic stress. Growth conditions for SiC materials include maintaining a generally convex growth surface of SiC crystals, adjusting differences in front-side to back-side thermal profiles of growing SiC crystals, supplying sufficient source flux to allow commercially viable growth rates for SiC crystals, and reducing the inclusion of contaminants or non-SiC particles in SiC source materials and corresponding SiC crystals. By forming larger dimension SiC crystals that exhibit lower crystallographic stress, overall dislocation densities that are associated with missing or additional planes of atoms may be reduced, thereby improving crystal quality and usable SiC crystal growth heights or lengths. As used herein, missing planes of atoms and additional planes of atoms may be used interchangeably to describe a stress state in a crystal, in either a compression or tension state.

SiC can be a very challenging crystalline material to grow since at normal pressures it does not have a liquid state but instead converts directly from a solid to a gas and back to a solid. This makes it different from most materials in that liquid phase growth is not available. Another major challenge for SiC crystal growth is the very low stacking fault energy observed in SiC which makes it very easy to introduce additional planes of atoms and their associated defect structures into the crystalline lattice. This low stacking fault energy combined with the very high temperatures employed in conventional physical vapor transport growth of SiC make it challenging to maintain growth in a regime where the energy available from local stress fields is below the energy required to create stacking faults. Crystallographic stress in SiC can be controlled by many factors. Crystal height and crystal diameter can play important roles as the stress can increase proportionately to the crystal height and to the square power of the crystal diameter. Conventional SiC growth techniques have achieved 100 and 150 millimeter (mm) diameter SiC crystals. Dimensions of such SiC crystals are typically limited to prevent induced crystal stress from exceeding a critical resolved shear stress for the SiC crystal where high densities of dislocations are formed. For larger diameter SiC crystals (e.g. exceeding 150 mm) as disclosed herein, the amount the diameter is increased can disproportionately increase the crystal stress, thereby producing shorter usable crystal heights during growth. In particular, stress levels in a crystal generally increase as the square of the diameter of the crystal increases. For example, general stress levels in a 200 mm SiC crystal would be expected to have about 1.78 times the stress of a 150 mm SiC crystal if grown according to the same conditions as the 150 mm SiC crystal. Additionally, stress is known to generally increase with a height or length of the grown crystal, thereby limiting larger diameter crystals to shorter growth heights or lengths so that the critically resolved shear stress is not exceeded.

Furthermore, induced growth stress and critical resolved shear stress can have different magnitudes in different crystal directions. In this regard, optimal low stress conditions correspond to a direction where both induced growth stress and critical resolved shear stress are at a minimum. For SiC, this corresponds with having the basal plane, or the (0001) plane, arranged perpendicular to the growth direction. For growth directions where the basal plane is non-perpendicular with the growth direction, higher associated stresses can be resolved onto the basal plane. In this manner, SiC crystals may be grown with the basal plane perpendicular to the growth direction for reduced stress conditions and subsequently cut at a number of degrees off-axis for device applications where off-axis SiC wafers are preferred. By not cutting wafers in directions substantially perpendicular to growth directions, top or bottom end portions of the grown crystal are not geometrically able to form SiC wafers and these unusable crystal portions scale with diameter. By way of example, cutting 4 degree off-axis wafers from a 150 mm diameter crystal may result in about a 10.5 mm height or length of unusable crystal. Scaling this up to a 200 mm diameter crystal would result in about 14 mm of unusable crystal. Additionally, larger diameter wafers may require increased thicknesses in order to retain suitable rigidity for subsequent device fabrication processes, thereby further decreasing how many wafers may be obtained from a given crystal growth height.

In this regard, conventional crystal growth techniques used for SiC crystals of 150 mm and below are not necessarily scalable for practically obtaining SiC crystals with larger diameters. According to the principles of the present disclosure, techniques are provided that exhibit lower crystallographic stresses, thereby allowing larger diameter SiC crystals (e.g., 200 mm and greater) with increased usable crystal heights. As used herein, a height or a length of a crystal material are terms that may be used interchangeably to refer to a dimension of the SiC crystal as measured in a direction perpendicular from a seed on which the SiC crystal is grown. As will be described in further detail below, such techniques include maintaining a generally convex growth surface of SiC crystals, supplying sufficient source flux to allow commercially viable growth rates for SiC crystals, and reducing the inclusion of contaminants or non-SiC particles in SiC source materials and corresponding SiC crystals.

General aspects of seeded sublimation growth processes for SiC are well established. As such, those skilled in the field of crystal growth and particularly those skilled in the field of SiC growth and related systems will recognize that specific details of a given technique or process can vary depending on many relevant circumstances, processing conditions, and equipment configurations. Accordingly, the descriptions given herein are most appropriately given in a general and schematic sense with the recognition that those persons of skill in the art will be able to implement and use various embodiments disclosed herein based on the provided disclosure without undue experimentation. Additionally, those skilled in this art will recognize that SiC sublimation systems of the type described herein are commercially available in various standard configurations. Alternately, sublimation systems may be designed and implemented in custom configurations, where necessary or appropriate. Accordingly, the embodiments described herein are not limited to a particular subset of sublimation systems, or any particular system configuration. Rather, many different types and configurations of sublimation systems may be used to grow crystalline SiC material in accordance with embodiments disclosed herein.

As used herein, a "substrate" refers to a crystalline material, such as a single crystal semiconductor material that may be formed from a bulk crystalline material. Bulk crystalline material may refer to a bulk crystal and a crystalline boule. As used herein, the term "bulk crystal" may be used interchangeably with the term "boule." In certain embodiments, a substrate may have sufficient thickness (i) to be surface processed (e.g., lapped and polished) to support epitaxial deposition of one or more semiconductor material layers, and optionally (ii) to be free-standing if and when separated from a rigid carrier. In certain embodiments, the terms "substrate" and "wafer" may be used interchangeably as a wafer is typically used as a substrate for semiconductor devices that may be formed thereon. As such, a substrate or a wafer may refer to free-standing crystalline material that has been separated from a larger or bulk crystalline material or substrate. In certain embodiments, a SiC wafer may have a generally cylindrical or circular shape, and/or may have a thickness of at least about one or more of the following thicknesses: 100 microns ($\mu m$), 200 $\mu m$, 300 $\mu m$, 350 $\mu m$, 500 $\mu m$, 750 $\mu m$, 1 mm, 2 mm, 3 mm, 5 mm, 1 centimeter (cm), 2 cm, 5 cm, 10 cm, 20 cm, 30 cm, or more. In certain embodiments, the thickness may include any number of ranges that include different combinations of the values listed above. For example, the thickness may be provided in a range including 200 $\mu m$ to 300 $\mu m$, or 200 $\mu m$ to 350 $\mu m$, or 200 $\mu m$ to 500 $\mu m$, or 200 $\mu m$ to 750 $\mu m$, or 200 $\mu m$ to 1 mm, and so on. In this regard, different thickness ranges may be provided that begin with each value listed above and end with all possible higher values listed above. In further embodiments, a SiC wafer may have a non-circular shape, such as a square or rectangular shape with any of the above-described dimensions. Principles of the present disclosure may be provided in the context of a circular wafer shape. However, any of the wafer diameter values provided may also refer to a dimension, or a longest dimension of the wafer, regardless of the wafer shape.

In certain embodiments, a wafer may include a thicker wafer that is divisible into two thinner wafers. In certain embodiments, a wafer may be part of a thicker wafer having one or more epitaxial layers (optionally in conjunction with one or more metal contacts) arranged thereon as part of a device wafer with a plurality of electrically operative devices. The device wafer may be divided to yield a thinner device wafer and a second thinner wafer on which one or more epitaxial layers (optionally in conjunction with one or more metal contacts) may be subsequently formed.

In certain embodiments, a wafer may comprise a diameter of approximately 200 mm or greater, or approximately 300 mm or greater, or approximately 450 mm or greater, or in a range including approximately 200 mm to approximately 450 mm, or in a range including approximately 200 mm to approximately 300 mm. With regard to relative dimensions, the terms "approximately" or "about" are defined to mean a nominal dimension within a certain tolerance, such as plus or minus 5 mm from a diameter dimension. To account for such tolerances, a wafer described herein with a "200 mm" diameter may encompass a diameter range including 195 mm to 205 mm, a wafer with a "300 mm" diameter may encompass a diameter range including 295 mm to 305 mm, and a wafer with a "450 mm" diameter may encompass a diameter range including 445 mm to 455 mm. In further embodiments, such tolerances may be smaller, such as plus or minus 1 mm, or plus or minus 0.25 mm. For wafers with a non-circular shape, any of the above-described diameter values may refer to a longest dimension of the wafer having a non-circular shape.

Methods disclosed herein may be applied to substrates or wafers of various crystalline materials, of both single crystal and polycrystalline varieties. In certain embodiments, methods disclosed herein may utilize cubic, hexagonal, and other crystal structures, and may be directed to crystalline materials having on-axis and off-axis crystallographic orientations. In certain embodiments, methods disclosed herein may be applied to semiconductor materials and/or wide bandgap materials. Exemplary materials include, but are not limited to, silicon carbide (SiC), silicon (Si), gallium arsenide (GaAs), sapphire, and diamond. In certain embodiments, such methods may utilize single crystal semiconductor materials having a hexagonal crystal structure, such as 4H—SiC, 6H—SiC, or Group III nitride materials (e.g., gallium nitride (GaN), aluminum nitride (AlN), indium nitride (InN), indium gallium nitride (InGaN), aluminum gallium nitride (AlGaN), or aluminum indium gallium nitride (AlInGaN)). In certain embodiments, a substrate or wafer may comprise 4H—SiC with a diameter of approximately 200 mm, or 300 mm or greater, and a thickness in a range of 100 μm to 1000 μm, or in a range of 100 μm to 800 μm, or in a range of 100 μm to 600 μm, or in a range of 150 μm to 500 μm, or in a range of 150 μm to 400 μm, or in a range of 200 μm to 500 μm, or in any other thickness range or having endpoints determined by any of the above-specified values. In this regard, different thickness ranges may be provided that begin with each value listed above and end with all possible higher values listed above.

Various illustrative embodiments described hereinafter mention SiC generally or 4H—SiC specifically, but it is to be appreciated that other suitable crystalline materials may be used. Among the various SiC polytypes, the 4H—SiC polytype is particularly attractive for power electronic devices due to its high thermal conductivity, wide bandgap, and isotropic electron mobility. Embodiments disclosed herein may apply to on-axis SiC (i.e., with no intentional angular deviation from the c-plane thereof) or off-axis SiC (i.e., typically departing from a grown axis such as the c-axis by a non-zero angle, typically in a range of from 0.5° to 10° or a subrange thereof such as 2° to 6° or another subrange). Certain embodiments disclosed herein may utilize on-axis 4H—SiC or vicinal (off-axis) 4H—SiC having an offcut in a range including 1° to 10°, or 2° to 6°, or about 2°, 4°, 6°, or 8°. Embodiments disclosed herein may apply to SiC wafers having multiple polytypes (e.g., 4H and 6H polytypes within a common SiC wafer).

Embodiments disclosed herein may also apply to both doped crystalline semiconductor materials (e.g., N-doped conductive SiC and/or P-doped SiC), co-doped, and/or undoped crystalline semiconductor materials (e.g., semi-insulating SiC or high resistivity SiC). In certain embodiments, SiC crystalline materials, including SiC boules and SiC wafers, may comprise N-type doping (including intentional and unintentional dopants such as nitrogen (N)) with concentrations in a range including $1\times10^{17}$ $cm^{-3}$ to $1\times10^{21}$ $cm^{-3}$, or in a range including $1\times10^{17}$ $cm^{-3}$ to $3\times10^{18}$ $cm^{-3}$, or in a range from $1\times10^{18}$ $cm^{-3}$ to $1\times10^{19}$ $cm^{-3}$, or in a range from $1\times10^{18}$ $cm^{-3}$ to $3\times10^{18}$ $cm^{-3}$, among others.

In certain embodiments, N-doped SiC crystalline materials may have a resistivity in a range including 0.001 ohm-cm to 0.05 ohm-cm, or in a range including 0.001 ohm-cm to 0.03 ohm-cm, or in a range from 0.005 ohm-cm to 0.05 ohm-cm, or in a range from 0.005 ohm-cm to 0.03 ohm-cm. In other embodiments, higher resistivity SiC crystalline materials, including semi-insulating SiC boules and semi-insulating SiC wafers, may comprise unintentionally doped or undoped SiC with a resistivity of at least 1500 ohm-cm, or at least 5000 ohm-cm, or at least 50,000 ohm-cm, or at least $1\times10^5$ ohm-cm, or at least $1\times10^6$ ohm-cm, or at least $1\times10^9$ ohm-cm, or at least $1\times10^{11}$ ohm-cm, or in a range including 1500 ohm-cm to $1\times10^{11}$ ohm-cm, or in a range including $1\times10^5$ ohm-cm to $1\times10^9$ ohm-cm, or in a range including $1\times10^5$ ohm-cm to $1\times10^{11}$ ohm-cm. Semi-insulating SiC wafers may be doped with boron (B), vanadium (V), aluminum (Al), or combinations thereof. Co-doped SiC wafers may comprise combinations of two or more dopants, such as N, Al, B, and V, among others depending on the embodiment.

Crystalline SiC can include various crystal defects, including dislocations (e.g., threading edge, threading screw, basal plane, and/or super screw dislocations or micropipes, among others), hexagonal voids, and stacking faults, among others. Mixed dislocations can include one or more combinations of different dislocations (e.g., threading edge, threading screw, basal plane, and/or super screw dislocations or micropipes) that intersect with one another or terminate with one another. For example, a mixed dislocation may include a threading screw dislocation and a basal plane dislocation that intersect or terminate with one another. The various crystal defects described above may be formed during crystal growth and/or during heat-up or cooldown after growth where one or more discontinuities are formed in the material lattice structure of crystalline SiC. Such crystal defects can be detrimental to fabrication, proper operation, device yield, and reliability of semiconductor devices subsequently formed on SiC wafers. In particular, defects related to missing prismatic planes of atoms may cause significant crystallographic stress that can limit practical wafer diameters and crystal growth lengths. These missing prismatic planes of atoms may be bounded by various dislocations, for example bounding basal plane dislocations may travel in-plane of a corresponding wafer and bounding threading edge dislocations may travel in a vertical direction relative to the plane of the wafer. While missing prismatic planes of atoms may be difficult to quantify, associated basal plane dislocations that bound such missing prismatic planes of atoms may be readily detectable with wafer imaging, including x-ray topography. By way of example, for a SiC wafer with a hexagonal crystal structure, basal plane dislocations that bound missing planes of atoms will be closely aligned with the {1$\bar{1}$00} family of crystallographic planes, for example within 5 degrees of any of the {1$\bar{1}$00} family of planes. With x-ray topography images, these basal plane dislocations will appear as lines that correspond with the {1$\bar{1}$00} family of planes, thereby allowing them to be readily distinguishable from other basal plane dislocations that are not associated with missing prismatic planes of atoms.

FIG. 1A is an x-ray topography image 10 of a 1 cm by 1 cm portion of a 4H—SiC wafer 12 where basal plane dislocations are visible that are closely aligned with the {1$\bar{1}$00} family of crystallographic planes. The SiC wafer 12 has approximately a 200 mm diameter and the image 10 is taken from an area that is closer to a perimeter of the wafer 12 than a center of the wafer 12. To obtain the image 10, x-ray topography imaging was performed in the transmission mode using (11$\bar{2}$0) transmission to highlight defects that may be aligned with the {1$\bar{1}$00} family of crystal planes. For illustrative purposes, three arrows 14-1 to 14-3 are provided to the right of the image 10 that indicate the orientation of the {1$\bar{1}$00} family of crystal planes relative to the image 10. As shown, multiple lines in the image 10 are visible that are closely aligned with one or more of these arrows 14-1 to 14-3. The lines indicate basal plane dislocations that are associated with missing planes of atoms. If lines were present that were misaligned, or more than 5 degrees off from the {1$\bar{1}$00} family of crystal planes, such lines would indicate basal plane dislocations that are associated with other defect mechanisms, for example a missing basal plane oriented plane of atoms in the crystal structure. In the image 10, multiple lines are closely aligned with orientations as indicated by either the 14-1 or the 14-3 arrows. In this manner, basal plane dislocations associated with missing planes of atoms form a diagonal cross-hatched pattern in the image 10. When these missing planes of atoms are too prevalent throughout a crystal structure, associated crystallographic stress can limit practical crystal growth heights and crystal diameters. In order to quantify basal plane dislocations associated with missing planes of atoms, a total line length of basal plane dislocations that are aligned within 5 degrees of the {1$\bar{1}$00} family of crystal planes may be measured manually or with automated image analysis. For example, in FIG. 1A, a total line length of such basal plane dislocations is around 170 centimeters per centimeter squared (cm/cm$^2$). When accounting for a thickness of the sample, 0.048 cm in the example of FIG. 1A, a total line density of basal plane dislocations that are aligned within 5 degrees of the {1$\bar{1}$00} family of crystal planes can be expressed as 3500 centimeters per centimeter cubed (cm/cm$^3$). In order to quantify basal plane dislocations associated with missing planes of atoms for an entire wafer, multiple images like the image 10 of FIG. 1A may be captured and analyzed.

Figure 1B:
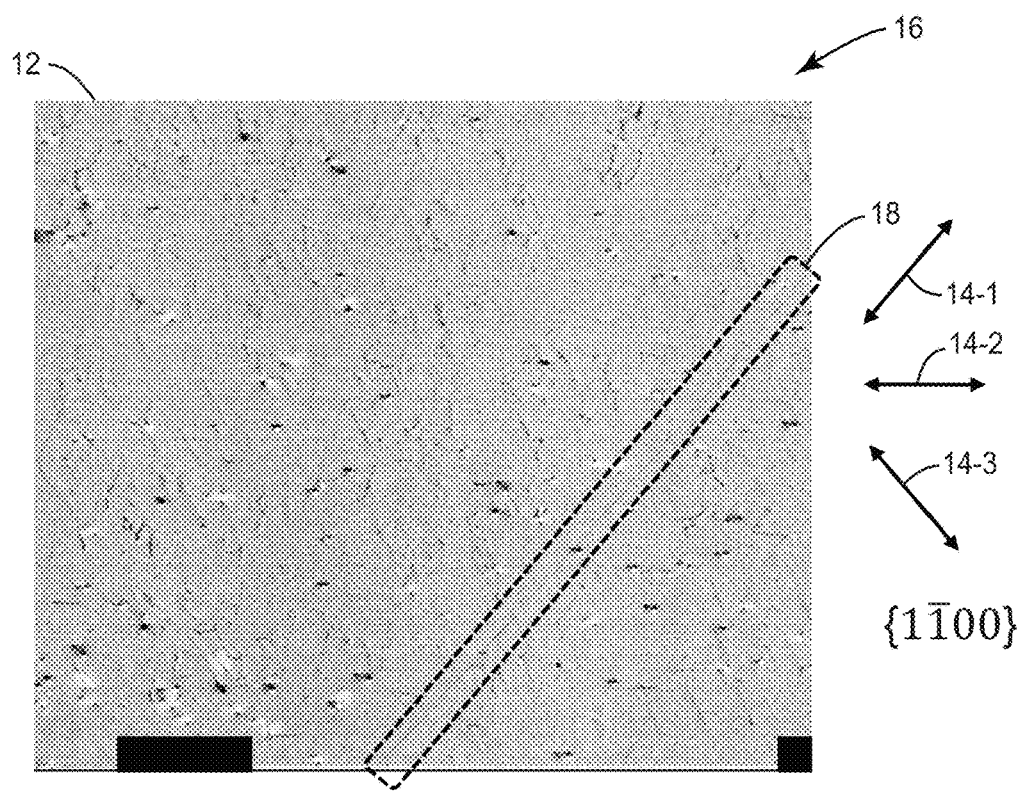
FIG. 1B is an x-ray topography image of a 1 cm by 1 cm portion of the same 4H—SiC wafer as the image of FIG. 1A for an area that has noticeably reduced basal plane dislocations that are closely aligned with the $\{1\bar{1}00\}$ family of crystallographic planes.

FIG. 1B is an x-ray topography image 16 of a 1 cm by 1 cm portion of the same 4H—SiC wafer 12 as the image 10 of FIG. 1A for an area that has noticeably reduced basal plane dislocations that are closely aligned with the {1$\bar{1}$00} family of crystallographic planes. In particular, a superimposed dashed-line box 18 is provided in the image 16 to highlight the location of a single basal plane dislocation line that is aligned with the orientation of the arrow 14-1. In this regard, a total line length of basal plane dislocations that are aligned within 5 degrees of the {1$\bar{1}$00} family of crystal planes is less than 1 cm/cm$^2$. When accounting for a thickness of 0.048 cm for the SiC wafer 12, a total line density of basal plane dislocations that are aligned within 5 degrees of the {1$\bar{1}$00} family of crystal planes is less than 20 cm/cm$^3$, indicating an area of the SiC wafer 12 where crystallographic stress is reduced during growth below levels needed to form missing planes of atoms. Stated differently, crystal strain is near or below levels for critically resolved shear stress.

Figure 1C:
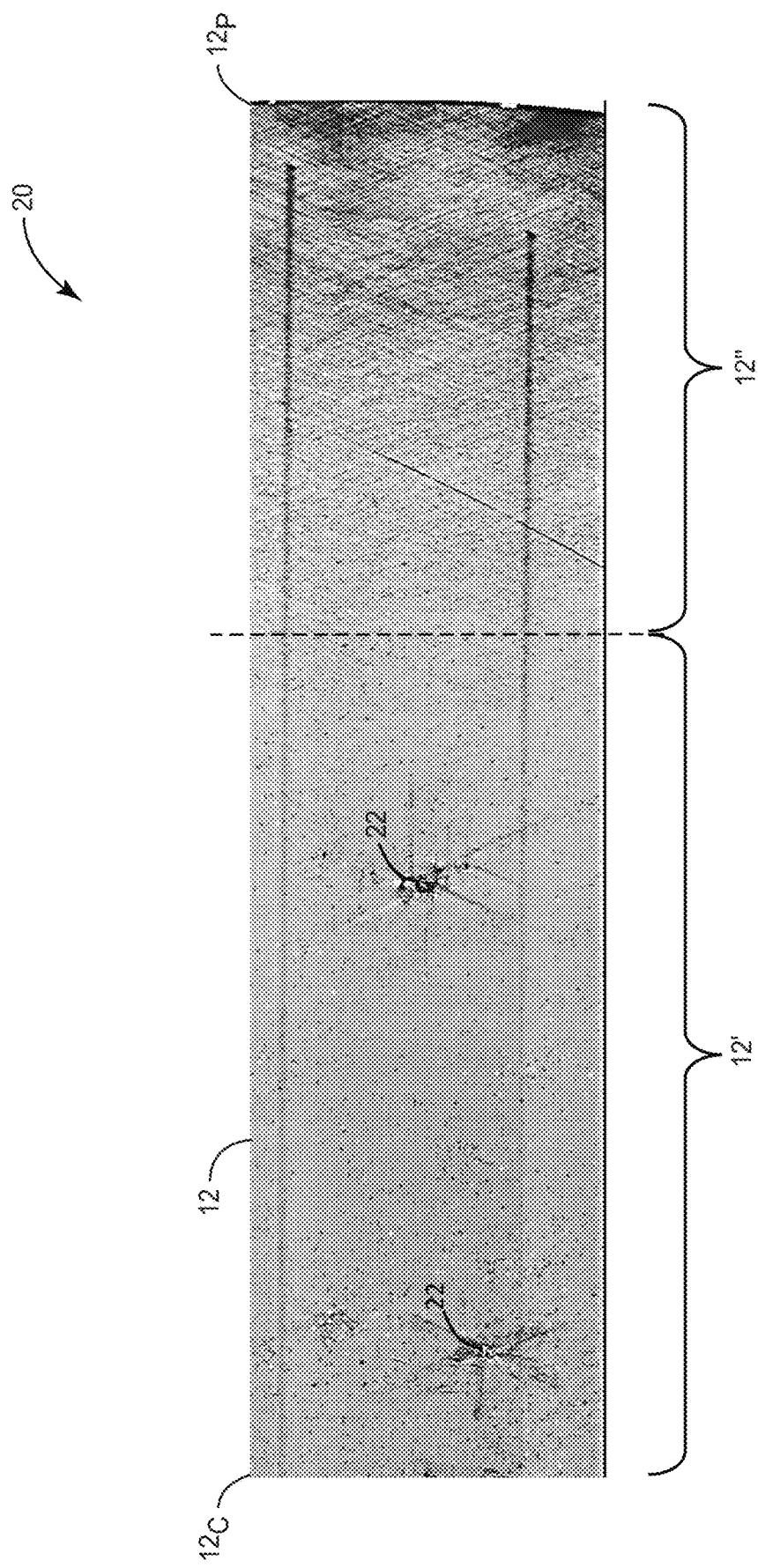
FIG. 1C is an x-ray topography image of a larger portion of the same 4H—SiC wafer as the image of FIG. 1A that spans from a wafer center to a wafer perimeter and shows that more than half of the 4H—SiC wafer has noticeably reduced basal plane dislocations that are closely aligned with the $\{1\bar{1}00\}$ family of crystallographic planes.

FIG. 1C is an x-ray topography image 20 of a larger portion of the same 4H—SiC wafer 12 as the image 10 of FIG. 1A that spans from a wafer center 12$_C$ to a wafer perimeter 12$_P$. As described above, the SiC wafer 12 has approximately a 200 mm diameter and accordingly, the image 20 spans a radius of approximately 100 mm from the wafer center 12$_C$ to the wafer perimeter 12$_P$. A superimposed vertical dashed line is provided that separates a first area 12' of the wafer 12 that has a lower density of basal plane dislocations that are aligned within 5 degrees of the {1$\bar{1}$00} family of crystal planes from a second area 12" that has a higher density of basal plane dislocations that are aligned within 5 degrees of the {1$\bar{1}$00} family of crystal planes. In particular, the superimposed vertical dashed line is provided approximately at a radius from the wafer center 12$_C$ where a total line density of basal plane dislocations that are aligned within 5 degrees of the {1$\bar{1}$00} family of crystal planes is less than 2000 cm/cm$^3$ for the first area 12' and greater than 2000 cm/cm$^3$ for the second area 12". As shown, the first area 12' spans more than half of the radius of the wafer 12 from the wafer center 12$_C$, thereby limiting high densities of stress-induced missing planes of atoms to the periphery of the wafer 12. Additionally, a large portion of the first area 12', particularly near the wafer center 12$_C$, has a total line density of such basal plane dislocations that is less than 100 cm/cm$^2$. The presence of two large micropipes 22 are noted in the image 20 and corresponding basal plane dislocation lines are shown that propagate in various directions from the micropipes 22. While basal plane dislocations associated with the micropipes 22 may not be related to missing planes of atoms as described above, the amount of such basal plane dislocations that are aligned with the {1$\bar{1}$00} planes in the image 20 is not significant enough to impact overall analysis. If more of such micropipes 22 were present, care may need to be taken to only count basal plane dislocations associated with missing planes of atoms.

Figure 2:
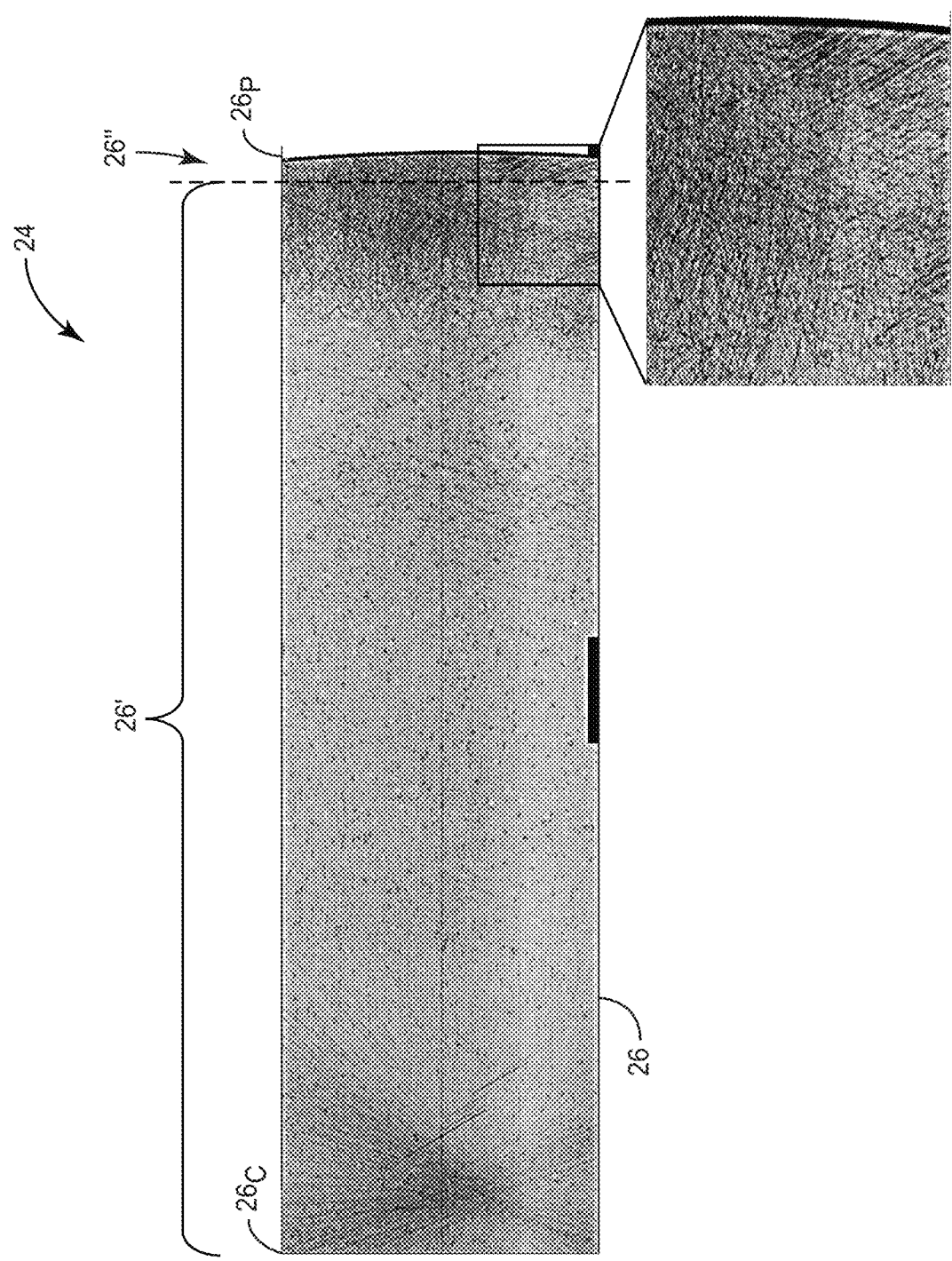
FIG. 2 is an x-ray topography image that is similar to the image of FIG. 1C, but for a different 4H—SiC wafer that exhibits an even larger area with reduced basal plane dislocations associated with missing planes of atoms.

FIG. 2 is an x-ray topography image 24 that is similar to the image 20 of FIG. 1C, but for a different 4H—SiC wafer 26 that exhibits an even larger area with reduced basal plane dislocations associated with missing planes of atoms. The SiC wafer 26 has approximately a 200 mm diameter and accordingly, the image 24 spans a radius of approximately 100 mm from a wafer center 26$_C$ to a wafer perimeter 26$_P$. The thickness of the SiC wafer 26 is the same as the SiC wafer 12 of FIG. 1C. A superimposed vertical dashed line is provided that separates a first area 26' of the wafer 26 that has a lower density of basal plane dislocations that are aligned within 5 degrees of the {1$\bar{1}$00} family of crystal planes from a second area 26" that has a higher density of basal plane dislocations that are aligned within 5 degrees of the {1$\bar{1}$00} family of crystal planes. As shown, the first area 26' spans at least 95% of the radius of the wafer 26, thereby limiting high densities of stress-induced missing planes of atoms to the second area 26" at the very periphery of the wafer 26. While increased amounts of darker features are visible from the wafer perimeter 26$_P$ that extend into the first area 26', most of these darker features are not related to missing prismatic planes of atoms. For example, an exploded view of a 1 cm by 1 cm portion taken from the wafer perimeter 26$_P$ is provided for closer inspection. As shown, the right side and the bottom right corner of the exploded view exhibit multiple diagonal lines that are aligned with the {1T00} family of crystal planes and are registered within the second area 26". The bottom left corner of the exploded view exhibits a few of such diagonal lines that are registered with the first area 26'. The remaining darker features in the exploded view are not aligned with the {1T00} family of crystal planes and are therefore not counted for the purpose of quantifying missing prismatic planes of atoms. In this manner, a total line density of basal plane dislocations associated with missing planes of atoms is less than 250 cm/cm$^3$ in the exploded view that spans both a portion of the first area 26' and the entire second area 26". It is noted that certain darker image features that are unrelated to missing planes of atoms are visible in areas of the image 24 that are at or near the wafer center 26$_C$. The pattern of these darker features is indicative of wafering artifacts that are formed during wafer separation and/or subsequent wafer processing. In this manner, image features that are readily attributed to post-growth processes can be excluded when quantifying basal plane dislocations related to missing planes of atoms. Even if such features were inadvertently counted, they do not appear to significantly alter the analysis as the total length would still be less than 12 cm/cm$^2$ near the wafer center 26$_C$.

Figure 3:
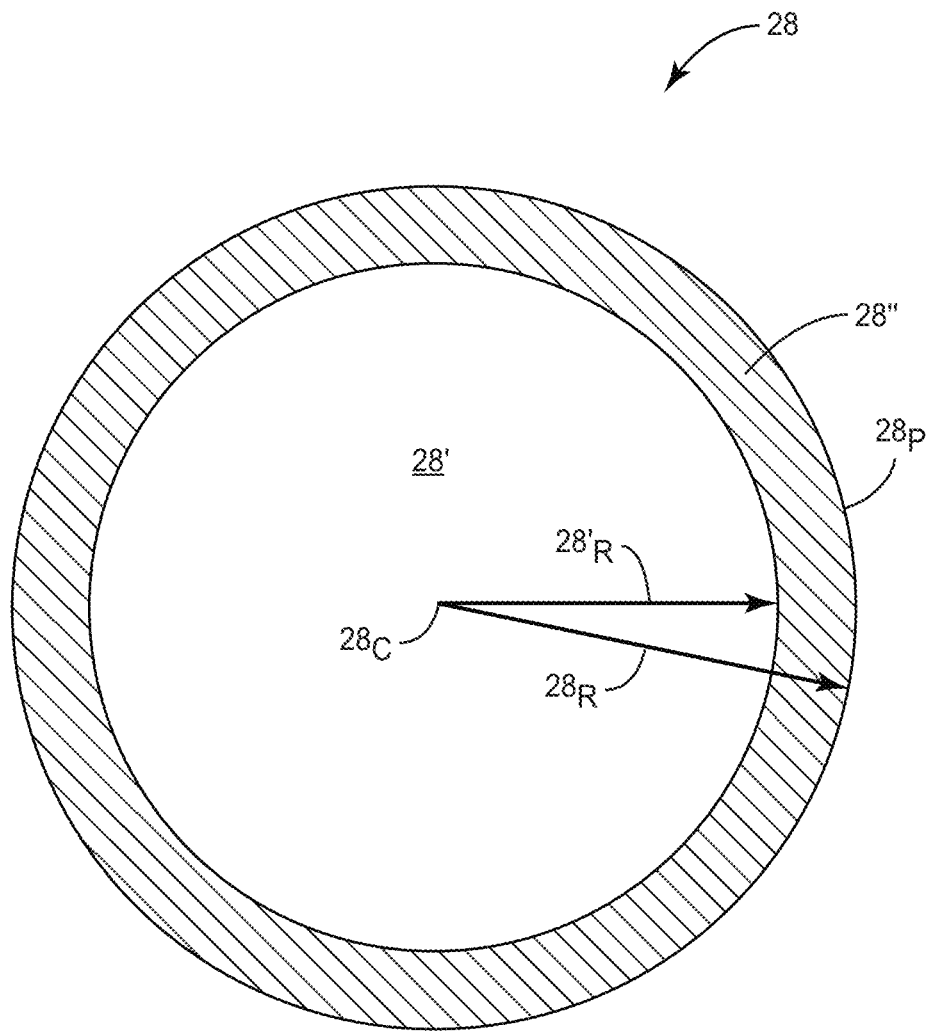
FIG. 3 is a front view illustration of an exemplary SiC wafer illustrating a first area that is bounded by a radius from a wafer center and a second area that is defined between the first area and the wafer perimeter.

As will be later described in greater detail, growth conditions and techniques are disclosed that provide large area SiC wafers having reduced crystallographic stress, like the exemplary SiC wafer 12 of FIGS. 1A-1C and the exemplary SiC wafer 26 of FIG. 2. By characterizing SiC wafers with x-ray topography as described above, overall crystallographic stress and missing planes of atoms for SiC wafers may be quantified in terms of line densities of corresponding basal plane dislocations per unit volume. FIG. 3 is a front view illustration of an exemplary SiC wafer 28 illustrating a first area 28' that is bounded by a radius 28'$_R$ from a wafer center 28c and a second area 28" that is defined between the first area 28' and a wafer perimeter 28$_P$. Based on the x-ray topography described above, a total line density of basal plane dislocations that are aligned within 5 degrees of the {1T00} family of crystal planes may be greater in the second area 28" than the first area 28'. According to embodiments of the present disclosure, the total line density of such basal plane dislocations in the first area 28' may be less than 1000 cm/cm$^3$, or less than 200 cm/cm$^3$, or less than 100 cm/cm$^3$, or any range beginning from 0 cm/cm$^3$, or 20 cm/cm$^3$ to any of the above values, corresponding to low densities of missing planes of atoms. In further embodiments, the total line density of such basal plane dislocations in the second area 28" may also be less than 1000 cm/cm$^3$, or less than 200 cm/cm$^3$, or less than 100 cm/cm$^3$, or any range beginning from 0 cm/cm$^3$, or 20 cm/cm$^3$ to any of the above values. For larger diameter SiC wafers, the radius 28'$_R$ that bounds the first area 28' may comprise at least 50%, or at least 75%, or at least 90%, or at least 95%, or 100% of an overall wafer radius 28$_R$ as measured the wafer perimeter 28$_P$. By way of example, if the SiC wafer 28 is a 200 mm wafer with a wafer radius 28$_R$ of 100 mm, the radius 28'$_R$ that defines the first area 28' may comprise at least 50 mm (e.g., the SiC wafer 12 of FIGS. 1A-1C), or at least 75 mm, or at least 90 mm, or at least 95 mm (e.g., the SiC wafer 26 of FIG. 2), or 100 mm. For SiC wafers where the radius 28'$_R$ is equal to the wafer radius 28$_R$, the first area 28' may extend across the entire SiC wafer 28.

Figure 4:
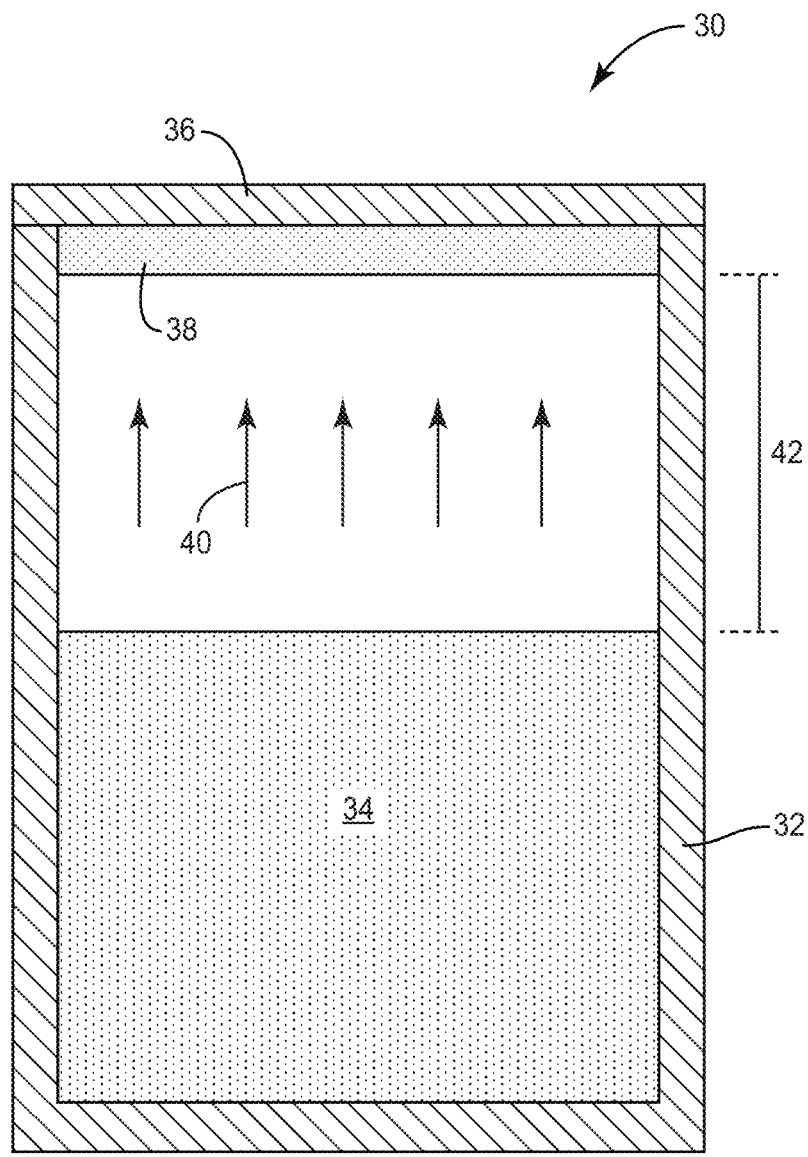
FIG. 4 is a cross-sectional illustration of a SiC growth system that includes a crucible, source material, and a crucible lid that may be used to provide crystal growth conditions with reduced crystallographic stress for production of large dimension boules and corresponding wafers.

FIG. 4 is a cross-sectional illustration of a SiC growth system 30 that includes a crucible 32, source material 34, and a crucible lid 36 that may be used to form a SiC crystal 38. In this regard, the SiC growth system 30 may be used to provide crystal growth conditions with reduced crystallographic stress for production of large width or diameter boules and corresponding wafers. While not shown, it is understood that a seed, for example a crystalline SiC material, may be placed near the crucible lid 36 for forming the SiC crystal 38 during growth. The source material 34 and the seed are generally contained in the crucible 32, and the source material 34 may be positioned above, below, or adjacent to the seed. The crucible 32 may comprise a material that is relatively stable to Si— and C-containing gases. In certain embodiments, the crucible 32 may include one or more of graphite, tantalum carbide (TaC)— and/or niobium carbide (NbC)-coated graphite, and solid TaC and NbC, among others. In certain embodiments, the crucible 32 may either be sealed to prevent gas escape, or partially open to allow some gas flow out of the crucible 32. In certain embodiments, the crucible 32 may be electrically conductive to allow induction heating, while in other embodiments radiative heating may be used, and in still other embodiments, combinations of induction and radiative heating may be used. In certain embodiments, the temperature profile in the crucible 32 may be controlled such that both the heat input to the system is considered and insulation baffles are used to control heat flow. In certain embodiments, the source material 34 may be kept at a higher temperature than the crucible lid 36 such that a temperature gradient is created within the crucible 32. This temperature gradient helps to provide the transport of a vapor flux 40 that contains Si— and C-containing gas species from the source material 34 to the SiC crystal 38. As the source material 34 sublimes and condenses to form the SiC crystal 38, the vapor flux 40 may also be driven by gas flow from the source material 34 to the SiC crystal 38. In certain embodiments, gas sources may either be driven through a high temperature region to enable cracking of the gas into constituent parts, or various gas species can interact directly with the SiC crystal 38. In certain embodiments, one or more high frequency electric fields are used to aid the gas cracking process.

Growth conditions for the SiC crystal 38 may typically be carried out by a supply of the vapor flux 40 for deposition of Si and C. The ways to achieve this are many and the embodiments described herein are provided for altering certain aspects of SiC crystal growth to reduce crystalline defects including missing planes of atoms in corresponding SiC crystals and resulting SiC wafers. The vapor flux 40 may be provided by generating one or more of SiC, SiC$_2$, Si$_2$C and Si gases through heating up the source material 34 that may include one or more of polycrystalline SiC; single crystalline SiC; polymers of Si and C; a mixture of Si and C powders with a 1:1 ratio of Si to C or within a 20% tolerance of the 1:1 ratio; a mixture of SiC, Si, and C powders where the Si to C ratio is 1:1 or within a 20% tolerance of the 1:1 ratio; pucks or lumps of amorphous or crystalline SiC (e.g., polycrystalline or single crystalline); and porous meshes of SiC. Depending on the application, source materials may include additional materials beyond Si and C, for example dopant source materials. In certain embodiments, gaseous sources may also be used to supply the vapor flux 40, separately or in addition to the source material 34 described above. Such gas sources may include one or more species such as SiH$_4$, Si$_2$H$_6$, SiCl$_2$H$_2$, SiCl$_3$H, SiCl$_4$, CH$_4$, C$_2$H$_6$ and Si(CH$_3$)$_4$. In embodiments that include a combination of gaseous and solid sources, the ratio of Si to C in the solid source may be altered away from 1:1 as some of the Si or C supply is being provided by the gas.

In certain embodiments, these sources may predominantly include pure SiC, but impurities may often be added to achieve deliberate doping of the crystals, modification of the surface energies, deliberate generation of point defects and modification of the lattice size. These impurities can include almost any element in the period table, often Group III elements such as boron (B) to induce p-type doping, or N to induce n-type doping, larger atomic radii atoms including Ge and Sn, V, and some lanthanides may be included to modify surface energies, and change the resultant crystal lattice parameter size, or introduce deep level electrical defects.

In certain embodiments, improved polytype control and growth rates may be obtained by controlling growth conditions to maintain a generally convex growth surface of the growing SiC crystal 38. This may be achieved by managing a radial thermal profile such that a central region of the SiC crystal 38 is cooler than perimeter portions in order to provide higher growth rates in the central region. If such thermal profiles are too great, crystallographic stress may be increased. A distance 42 between the source material 34 and the SiC crystal 38 partially contributes to a thermal gradient between the source material 34 and the SiC crystal 38. Higher thermal gradients may be associated with increased crystal stress during growth while lower thermal gradients may be associated with lower growth rates. In this regard, simply lowering thermal gradients to avoid crystal stress may result in lower growth rates that are impractical for providing production-scale quantities of the SiC crystal 38. Additionally, if the distance 42 is too short, achievable boule heights or lengths of the growing SiC crystal 38 can be limited.

While providing the convex growth surface may be important for polytype control and reduced formation of certain crystallographic defects, controlling the radial thermal profile without introducing missing planes of atoms can be a challenge, particularly for larger diameter SiC crystals. In particular, any deviations in the radial thermal profile from the front-side or growing surface of the SiC crystal 38 to a back-side of the SiC crystal 38 that is closer to the seed and the crucible lid 36 can induce in-crystal shear stresses and missing planes of atoms. According to aspects of the present disclosure, various crystal growth techniques are described that promote the convex growth surface while also reducing front-side to back-side deviations in the radial thermal profile of the growing SiC crystal 38. In certain embodiments, shadow masking may be employed to a front-side of the growing SiC crystal 38 to promote the convex growth surface without the need to provide higher gradients in the back-side thermal profile. To allow larger boule heights for the SiC crystal 38 when a shadow mask is present, the SiC crystal 38 may be slowly moved away from the source material 34 to allow more physical space for growth of the SiC crystal 38 while also maintaining conditions for the convex growth surface. Additionally, moving the SiC crystal 38 slowly away from the source material 34 may also provide a consistent distance from the surface of the growing SiC crystal 38 to the source material 34. The above effects may also be realized by slowing moving the source material 34 away from the growing crystal 38.

Figure 5:
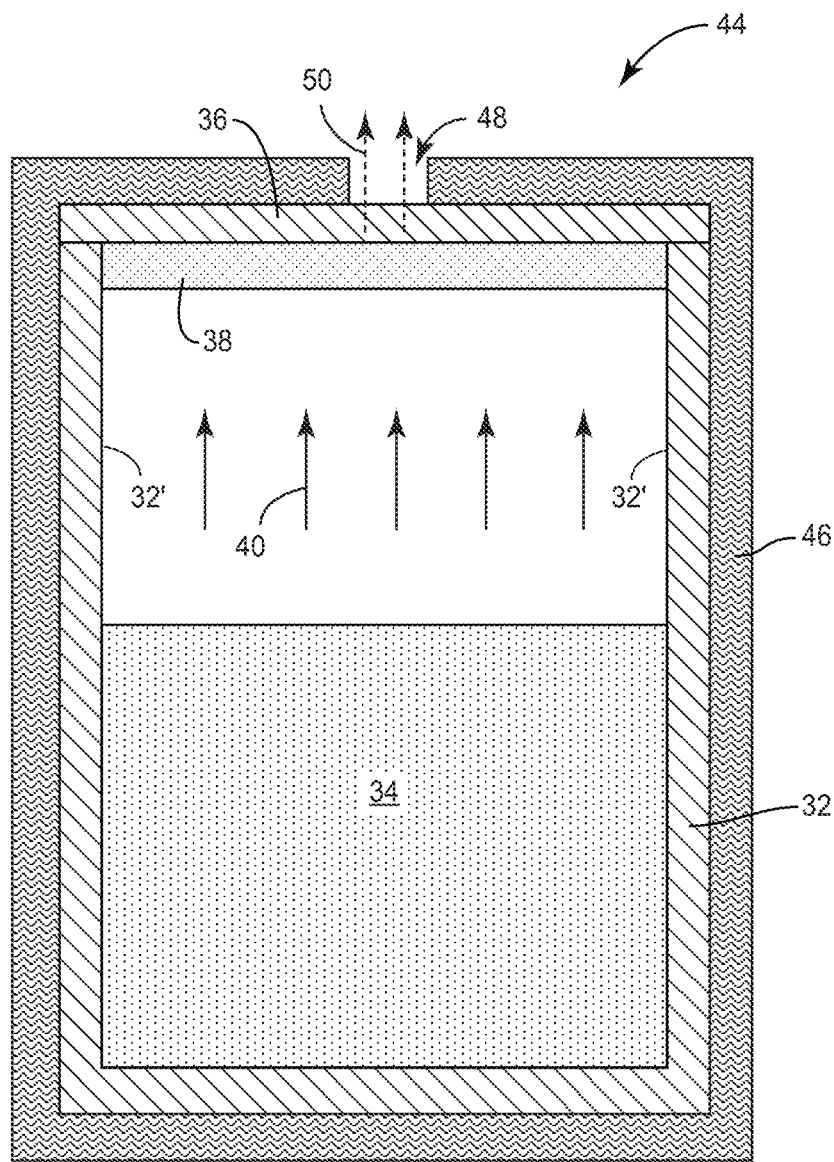
FIG. 5 is a cross-sectional illustration of another SiC growth system that may provide crystal growth conditions with reduced crystallographic stress for production of large dimension boules and corresponding wafers.

FIG. 5 is a cross-sectional illustration of a SiC growth system 44 that may provide crystal growth conditions with reduced crystallographic stress for production of large width or diameter boules and corresponding wafers. In certain embodiments, the SiC growth system 44 includes an arrangement that promotes additional heat dissipation at a center of the crucible lid 36. An insulation layer 46 is illustrated that surrounds the crucible 32 and the crucible lid 36. The insulation layer 46 forms an opening 48 that is registered with the center of the crucible lid 36 and the SiC crystal 38. In this manner, heat 50 may more readily dissipate at the opening 48, thereby providing a radial thermal profile that has a cooler central portion of the SiC crystal 38 for forming the convex growth surface. In certain embodiments, the size and location of the opening 48 may be configured for promoting the convex growth surface and matching of the front-side to back-side thermal profiles for reduced formation of missing planes of atoms. While the opening 48 is illustrated as being formed entirely through an entire thickness of the insulation layer 46, the opening 48 may also embody a partial opening such that the insulation layer 46 has a reduced thickness at the opening 48. In further embodiments, the back-side thermal profile of the SiC crystal 38 may be dynamically adjusted during growth so that higher gradients in the thermal profile that may be beneficial at the start of growth can be reduced during later growth stages. For example, a position of the insulation layer 46 and the opening 48 (or partial opening) relative to the crucible 32 may be moved during growth. Alternatively, a position of the SiC crystal 38 with respect to the insulation layer 46 may also be shifted during growth. In still further examples, the opening 48 may be closed, opened, and/or resized during growth to compensate for any changes in the front-side to back-side thermal profiles as the SiC crystal 38 grows longer. Active heating elements may be provided around a periphery of the crucible 32 and/or registered with a center of the crucible 32 that may be dynamically adjusted during growth.

In certain embodiments, the silicon carbide growth system 44 may include a design of the crucible 32 that provides increased vapor flux 40 to a center of the SiC crystal 38 for promoting the convex growth surface. For example, one or more interior sidewalls 32' of the crucible 32 may be formed with one or more sidewall features that provide an orifice or passageway for the vapor flux 40 within the crucible 32 that is smaller than a diameter of the SiC crystal 38. Various sidewall features on the interior sidewalls 32' may be integral with the crucible 32 or a separate component that is attached to the crucible 32. Sidewall features may include one or more protrusions that extend away from the interior sidewalls 32' toward a center of the crucible 32 to define the orifice or passageway. Depending on the embodiment, the resulting orifice or passageway may be formed with any number of shapes, including circular, rectangular, and hexagonal. A hexagonal orifice or passageway may provide alignment with one or more of the [1120] and/or [10$\bar{1}$0] crystal directions. In certain embodiments, the orifice or passageway may form a slit within the crucible 32 or a protrusion may embody an opening or openings. Surfaces of various sidewall features may also be machined to different roughness levels in order to manage nucleation sites for SiC growth along the crucible 32. In still further embodiments, the sidewall features of the interior sidewalls 32' may comprise recesses in the crucible 32 or even regions were portions of the vapor flux 40 may be vented from the crucible 32. In this manner, vapor flux 40 is allowed to propagate freely toward the center of the SiC crystal 38, while vapor flux 40 at the perimeter of the SiC crystal is at least partially obstructed or removed by the sidewall features arranged along the interior sidewalls 32'. Accordingly, higher growth rates in central portions of the SiC crystal 38 may be achieved without requiring larger radial thermal profiles in the SiC crystal 38, thereby promoting the convex growth surface with reduced crystallographic stress and missing planes of atoms. In order to effectively guide the vapor flux 40 preferentially toward the SiC crystal 38, the sidewall features may need to be positioned not too far away from the SiC crystal 38. For example, the sidewall features may be provided on the interior sidewalls 32' at a distance that is less than half a diameter of the SiC crystal 38 to ensure the vapor flux 40 is preferentially delivered to a center of the SiC crystal 38. In further embodiments, the crucible 32 may have different sidewall features located in different vertical portions of the interior sidewalls 32' of the crucible 32 for guiding the vapor flux 40 in a desired manner. In certain embodiments where the sidewall features are present, the growing SiC crystal 38 may be gradually moved in a direction away from the sidewall features to enable larger boule heights. In certain embodiments, the sidewall features may alternatively embody a source tube that supplies the vapor flux 40 preferentially to the center of the SiC crystal 38. In further embodiments, the insulation layer 46 may form the opening 48 in combination with any sidewall features of the interior sidewalls 32' of the crucible 32, or in combination with any of the other principles of the present disclosure as disclosed herein.

In certain embodiments, the SiC growth system 44 may include a design that accounts for formation of a boundary layer that may be present during growth. At growth temperatures for SiC, the vapor flux 40 provided by the source material 34 may provide more Si species than C species, but the growing SiC crystal 38 generally accepts equal amounts of each. In this regard, excess species of the vapor flux 40 may be rejected to form a boundary layer in the crucible 32 along a surface of the growing SiC crystal 38. The boundary layer can include both C species and Si species. After formation of the boundary layer, subsequent vapor flux 40 must now pass through the boundary layer in order to reach the surface of the SiC crystal 38. The boundary layer may therefore limit growth rates of the SiC crystal 38. In order to account for the boundary layer and allow vapor flux 40 to reach the SiC crystal 38 in a more controlled manner, a tube may be provided in the crucible 32 that is configured to provide a disruptive gas flow to the boundary layer. For example, an inert gas may be provided through the tube and toward the center of the boundary layer, thereby interrupting or reducing a thickness of the boundary layer along a center of the SiC crystal 38. In this manner, the growth rate of the SiC crystal 38 may be increased in the center without requiring larger radial thermal profiles that could otherwise promote crystallographic stress. In certain embodiments, the tube may comprise graphite, TaC, NbC, graphite that is coated with one or more of TaC and NbC, and combinations thereof. The inert gas may comprise argon (Ar) and may be provided to the boundary layer in pulses or with a constant flow in amounts that promote improved delivery of the vapor flux 40. The tube may be provided from the bottom of the crucible 32, or in other locations along the interior sidewall 32' of the crucible 32 to provide controlled disruption of the boundary layer. Other ways to disrupt the boundary layer include one or more combinations of periodically reducing and rebuilding a gas pressure in the crucible 32, application of ultrasonic or low frequency pulses to the growing SiC crystal 38 and/or the boundary layer, rotating the SiC crystal 38 during growth at constant or variable speeds, and arranging specific exhaust paths that manage gas flow patterns. In further embodiments, any of the above-described principles for accounting for a boundary layer may be used singularly or in combination with any of the insulation layer 46 and the opening 48, and/or in combination with the sidewall features of the crucible 32, or in combination with any of the other principles of the present disclosure as disclosed herein.

For growth of larger width or diameter SiC boules, for example 200 mm and above, it becomes increasingly more difficult to maintain a suitable stoichiometric ratio of Si and C containing species from the vapor flux 40 over the entire surface of the SiC crystal 38. For example, the Si/C ratio can be higher in the center of the growth surface than at the edges of the growing SiC crystal 38. This can cause step bunching and terrace formation to more prevalent in the crystal 38, thereby inducing defects in the resulting crystal. Several mechanisms are provided that adjust or tailor relative Si/C ratios in a radial direction of the growing SiC crystal 38, or that alter the surface and step free energies for reducing the creation of large surface terraces. It should be noted that the SiC crystal 38 may exhibit different defects if the relative Si/C ratios are either too high or too low, so an adjustment of the Si/C ratios may be required for a particular set of growth conditions. The range of suitable Si/C ratios may be effectively reduced if there is too much variance in Si/C ratios along a radius of the growing SiC crystal 38 from center to edge, hence making it considerably more challenging to maintain suitable Si/C ratios for larger diameter growth conditions. As described above, various manners for achieving Si/C ratios in the vapor flux 40 across the growing SiC crystal 38 may include providing one or more of the opening 48 in the insulation material 46, providing various sidewall features for the interior sidewalls 32' of the crucible 32, and various techniques for disrupting boundary layers.

In certain embodiments, various parameters accordingly include altering the crystal surface temperature of the growing SiC crystal 38 and altering the composition of the incoming gas or vapor flux 40. In certain embodiments, growth techniques may include adjustment of the magnitude of the Si and C containing species in the vapor flux 40. Additionally, the vapor flux 40 may include other atomic species in the gas phase, for example N, Ar, He, B, and/or other metallic species. The presence of other atomic species may be provided throughout growth of the SiC crystal 38, or at certain portions of growth within the crucible 32 and/or on the growth surface of the SiC crystal 38. For example, the other atomic species may be provided as one or more bursts within the vapor flux 40 at a beginning, in the middle, and/or toward the end of growth. In other embodiments, the other atomic species may be provided in variable amounts that are different in different portions of growth of the SiC crystal 38. In still other embodiments, one or more of the other atomic species may be provided in one or more bursts while others of the one or more atomic species are provided in a continuous manner during one or more portions of growth.

In certain embodiments, an electric field between the SiC crystal 38 and the source material 34 and/or an energy spectrum of the arriving radiation may be utilized to control growth conditions. In certain embodiments, the presence and/or distribution of threading edge and threading screw dislocations within a seed used for growth may be tailored for large diameter growth. One or more interruptions of the vapor flux 40 may be provided during growth to allow a restructuring of the crystal surface of the SiC crystal 38. In certain embodiments, the strain present in the SiC crystal 38 due to either thermal gradients or built in dislocation networks may provide an alteration of the in plane lattice constant, thereby altering surface energy parameters. In certain embodiments, a doping level of the growing SiC crystal 38 may be adjusted, thereby leading to differential radiation absorption and differing axial thermal gradients near the surface of the SiC crystal 38.

The principles of the present disclosure may be utilized for growth of the SiC crystal 38 with a crystallographic orientation of the corresponding growth surface that is from 0 degrees up to several degrees off axis, depending on the embodiment and for either polarity of the growth surface (e.g., C-face or Si-face). In still further embodiments, the choice of a main crystal growth plane for the SiC crystal 38 may be selected from other basal planes, for example the M-plane family $\{1\bar{1}00\}$ or M-face of a hexagonal crystallographic structure, the A-plane family $\{11\bar{2}0\}$ or A-face of a hexagonal crystallographic structure, or along the $\{03\bar{3}8\}$ crystal planes of a hexagonal crystallographic structure by selection of a corresponding seed. In this regard, SiC crystal boules may be grown along the M-face, the A-face, or along the $\{03\bar{3}8\}$ crystal planes according to any of the principles of the present disclosure. In this manner, such SiC crystals may be referred to as M-face SiC crystals or M-face SiC boules, or A-face SiC crystals or A-face SiC boules, or $\{03\bar{3}8\}$-face SiC crystals or $\{03\bar{3}8\}$-face SiC crystal boules. After growth, such SiC crystal boules may then be cut into SiC wafers along the (0001) crystal plane (or C-face or C-plane) or several degrees off axis (e.g., to about 10°) from the (0001) crystal plane. Alternatively, such SiC crystal boules may be cut along the M-face, the A-face, or along the $\{03\bar{3}8\}$ crystal planes in which they were grown. In certain embodiments, corresponding M-face and/or A-face wafers may comprise a circular shape or a non-circular shape, for example rectangular.

Other growth techniques for increasing achievable boule heights for SiC crystals with suitably low crystallographic stress, particularly for large diameter crystals, include improvements to the source material. In SiC crystal growth, boule height, yield, and cost may be a function of a weight of the source material that may be placed within the crucible. In this manner, increasing a density of the source material may allow an increased weight of the source material in a crucible, thereby providing higher boule heights and yields with reduced costs. The source material may include one or more of polycrystalline SiC, single crystalline SiC, polymers of Si and C, powders of Si, C, and/or SiC, pucks or lumps of amorphous or crystalline SiC, solid blocks or other solid forms of SiC, and porous meshes of SiC, among other forms of SiC. In certain aspects, the source material for SiC growth may comprise a SiC powder with a tap density of about 0.9 to 1.3 grams per cubic centimeter (g/cm$^3$). As used herein, tap density, or tapped density, refers to a mass of the powder divided by a final volume of the powder after a tapping process has been employed for a suitable amount of time and/or a suitable number of taps (for example 1200 taps). According to aspects of the present disclosure, the particle size distribution of the SiC powder may be configured to provide a tap density of at least 1.5 g/cm$^3$, or at least 1.8 g/cm$^3$, or at least 2.0 g/cm$^3$, or at least 2.5 g/cm$^3$, or in a range from 1.5 g/cm$^3$ to 2.5 g/cm$^3$, or in a range from 1.8 g/cm$^3$ to 2.5 g/cm$^3$, or in a range from 2.0 g/cm$^3$ to 2.5 g/cm$^3$, or in a range from 1.8 g/cm$^3$ to 3.2 g/cm$^3$, or in a range from 2.0 g/cm$^3$ to 2.5 g/cm$^3$ with decreased contamination. In certain aspects, SiC powders with any of the above-described tap densities may pressed to form a solid SiC source material with a source density in a range from 0.9 g/cm$^3$ to 3.2 g/cm$^3$, or in a range from 1.3 g/cm$^3$ to 3.2 g/cm$^3$, or in a range from 1.5 g/cm$^3$ to 3.2 g/cm$^3$, or in a range from 1.8 g/cm$^3$ to 3.2 g/cm$^3$, or in a range from 1.8 g/cm$^3$ to 2.5 g/cm$^3$, or in a range from 2.0 g/cm$^3$ to 2.5 g/cm$^3$. With such improvements to the SiC powder of the source material, achievable boule heights may be doubled, tripled, or more compared with conventional source materials.

The particle size distribution and corresponding density of conventional SiC powders used for source materials has been limited due to contamination introduced during powder production. For example, conventional milling media may be used to form SiC powders and may typically show contaminate levels on the order of $10^{-1}$ to $10^0$ parts per million (ppm). Such contaminate levels limit particle size distributions in powders to larger values, thereby providing lower densities (e.g., 1.3 g/cm$^3$). According to aspects of the present disclosure, improved milling media may be provided by SiC crystals that have higher purity levels as compared with conventional milling media. In this regard, SiC boules may be divided and processed to form milling media with significantly reduced contaminant levels.

Figure 6:
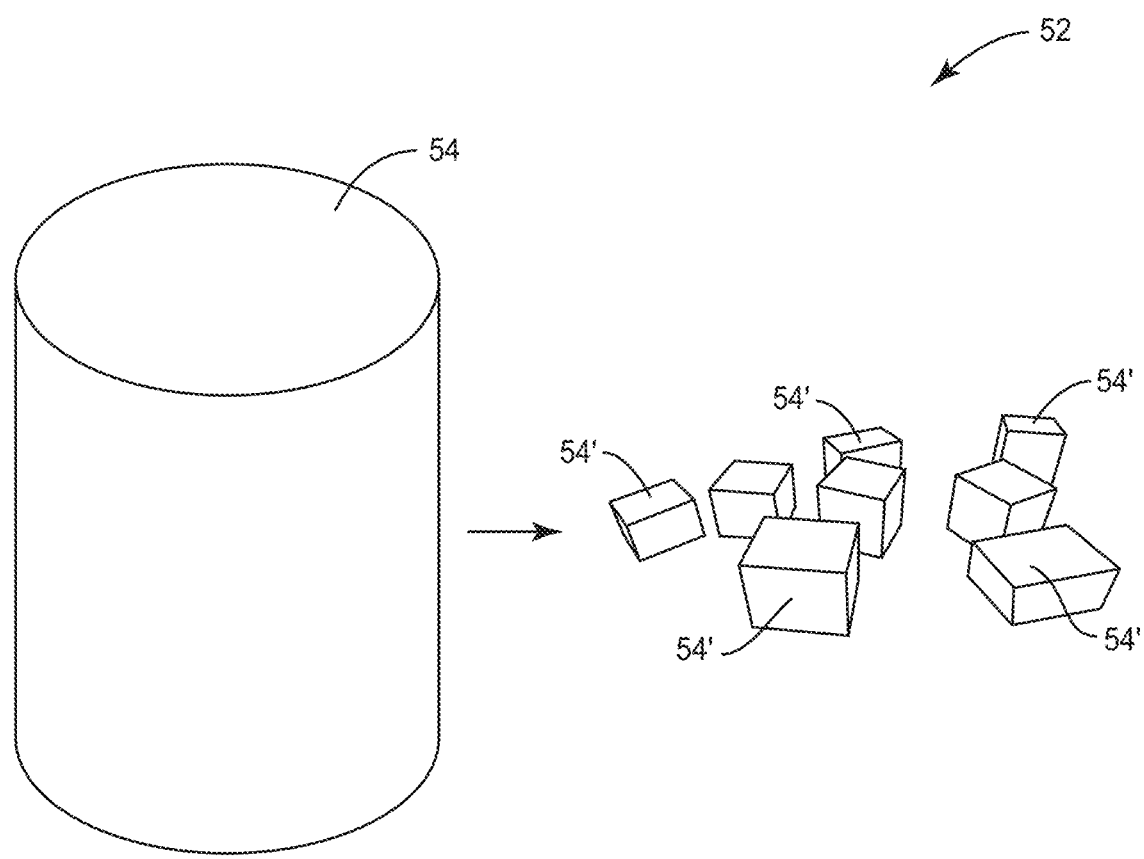
FIG. 6 illustrates a generalized process for forming a SiC crystal into milling media for subsequent use in milling SiC powders with increased density levels and reduced contamination.

FIG. 6 illustrates a generalized process 52 for forming a SiC crystal 54 into milling media 54' for subsequent use in milling SiC powders with increased density levels and reduced contamination. The SiC crystal 54 may embody any solid SiC crystalline material, for example a SiC boule grown according to conventional crystal growth techniques or any of the crystal growth techniques of the present disclosure. In certain embodiments, the SiC crystal 54 may not necessarily meet production targets, including doping levels and crystallographic defects, among others. Rather than scrapping the SiC crystal 54, it may be used to form the milling media 54'. In other embodiments, the SiC crystal 54 does not have be considered production scrap material. In order to form the milling media 54', the SiC crystal 54 may be separated by wire sawing into smaller cubic parts with dimensions ranging from 5 mm by 5 mm to 15 mm by 15 mm, although other dimensions may also be provided. After separating the SiC crystal 54 into the smaller milling media 54', any residual surface contamination may be removed by subjecting the milling media 54' to one or more initial powder milling runs to effectively polish the milling media 54'. Additionally, residual surface contamination may be removed by subjecting the milling media 54' to chemical etching. In certain embodiments, removal of surface contamination may be achieved individually by initial powder milling runs or chemical etching, or with combinations of initial powder milling runs and chemical etching. In addition to the above-described surface contamination removal steps, other cleaning techniques may also be contemplated without deviating from the principles of the present disclosure.

After appropriate removal of surface contamination, the milling media 54' may be used to mill SiC powder with reduced particle size and suitable particle size distribution for forming a high density SiC powder source material with reduced contamination. While the milling media 54' is shown in cubic form, the milling media 54' may also be provided in other shapes, such as round or oval balls. Additionally, the milling media 54' may also be used to mill other materials beyond SiC source powders. In still further embodiments, SiC powder that is milled with the milling media 54' may be subjected to ceramic forming techniques to form the SiC powder into additional milling media of a variety of sizes and shapes.

According to aspects disclosed herein, one or more of the above-described improved crystal-growth techniques described for FIGS. 4-5 and the source material improvements described relative to FIG. 6, alone or in various combinations with each other, may provide large diameter SiC crystals with reduced crystallographic stress and larger boule heights. In certain embodiments, SiC crystals with a diameter of approximately 200 mm may be formed with boule heights of greater than 50 mm, or greater than 100 mm, or greater than 200 mm, or in a range from 50 mm to 300 mm, or in a range from 100 mm to 300 mm, or in any number of ranges that include different combinations of the values listed above. For such boule heights, at least 50%, or at least 60%, or at least 75%, or at least 90%, or in a range from 50% to 90%, or in a range from 60% to 90%, or in a range from 50% to 75%, or in a range from 60% to 75%, or any other range that is bounded by any of the above values, of the boule height may be configured to provide a plurality of SiC wafers and each SiC wafer of the plurality of SiC wafers comprises reduced crystallographic stress and missing planes of atoms. That is, at least the above percentages of the boule height may be capable of producing SiC wafers having a total line density of basal plane dislocations that are aligned within 5 degrees of the $\{1\bar{1}00\}$ family of crystal planes of less than 1000 cm/cm$^3$, or less than 200 cm/cm$^3$, or less than 100 cm/cm$^3$, or any range beginning from 0 cm/cm$^3$, or 20 cm/cm$^3$ to any of the above values for an area bounded by a radius that is at least 50%, or at least 90%, or at least 95% of an overall wafer radius. Additionally, any of the above boule heights and corresponding percentages may equally apply to SiC boules grown along M-face, the A-face, or along the $\{03\bar{3}8\}$ crystal planes according to principles of the present disclosure. As previously described, the choice of which combinations of growth techniques and source materials may be utilized can be dependent on specifics related to each particular sublimation system. In this regard, those skilled in the field of crystal growth and particularly those skilled in the field of SiC growth and related systems will recognize that specific details of a given technique, process, choice of source material and combinations thereof may be chosen relevant to specific circumstances and processing conditions for each specific crystal growth configuration.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A silicon carbide (SiC) wafer comprising a dimension of at least 195 millimeters (mm) and a total line density of basal plane dislocations that are aligned within 5 degrees of a $\{1\bar{1}00\}$ family of crystal planes of less than 1000 centimeters per centimeter cubed (cm/cm$^3$) for a first area bounded by a radius from a center of the SiC wafer, the radius comprising at least 50% of a wafer radius of the SiC wafer.

2. The SiC wafer of claim 1, wherein the dimension is in a range from 195 mm to 205 mm.

3. The SiC wafer of claim 1, wherein the dimension is in a range from 195 mm to 455 mm.

4. The SiC wafer of claim 1, wherein the total line density of basal plane dislocations that are aligned within 5 degrees of the $\{1\bar{1}00\}$ family of crystal planes in a range from 0 cm/cm$^3$ to less than 1000 cm/cm$^3$.

5. The SiC wafer of claim 1, wherein the total line density of basal plane dislocations that are aligned within 5 degrees of the $\{1\bar{1}00\}$ family of crystal planes in the first area is less than 200 cm/cm$^3$.

6. The SiC wafer of claim 1, wherein the total line density of basal plane dislocations that are aligned within 5 degrees of the $\{1\bar{1}00\}$ family of crystal planes in the first area is less than 100 cm/cm$^3$.

7. The SiC wafer of claim 1, wherein the radius that bounds the first area comprises at least 90% of the wafer radius of the SiC wafer.

8. A SiC wafer comprising:
   a dimension of at least 195 millimeters (mm) and a total line density of basal plane dislocations that are aligned within 5 degrees of a $\{1\bar{1}00\}$ family of crystal planes of less than 1000 centimeters per centimeter cubed (cm/cm$^3$) for a first area bounded by a radius from a center of the SiC wafer, the radius comprising at least 50% of a wafer radius of the SiC wafer; and
   a second area that is defined between the first area and a perimeter edge of the SiC wafer, wherein the second area comprises a total line density of basal plane dislocations that are aligned within 5 degrees of the $\{1\bar{1}00\}$ family of crystal planes that is higher than the first area.

9. The SiC wafer of claim 8, wherein the total line density of basal plane dislocations that are aligned within 5 degrees of the $\{1\bar{1}00\}$ family of crystal planes in the second area is less than 1000 cm/cm$^3$.

10. The SiC wafer of claim 1, wherein the SiC wafer comprises at least one of a 4H—SiC wafer, a semi-insulating SiC wafer, and a n-type SiC wafer.

* * * * *